United States Patent
Pilo et al.

(10) Patent No.: US 6,501,675 B2
(45) Date of Patent: Dec. 31, 2002

(54) ALTERNATING REFERENCE WORDLINE SCHEME FOR FAST DRAM

(75) Inventors: Harold Pilo, Underhill, VT (US); Robert E. Busch, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/854,987

(22) Filed: May 14, 2001

(65) Prior Publication Data

US 2002/0176275 A1 Nov. 28, 2002

(51) Int. Cl.$^7$ ............................................. G11C 11/24
(52) U.S. Cl. ...................................... 365/149; 365/190
(58) Field of Search ................................ 365/149, 190, 365/202

(56) References Cited

U.S. PATENT DOCUMENTS

| | | | |
|---|---|---|---|
| 5,621,680 A | 4/1997 | Newman et al. ............. | 365/145 |
| 5,737,260 A | 4/1998 | Takata et al. ................ | 365/145 |
| 5,751,626 A | 5/1998 | Seyyedy ...................... | 365/145 |
| 5,852,571 A | 12/1998 | Kinney ........................ | 365/145 |
| 5,978,250 A | 11/1999 | Chung et al. ................ | 365/145 |
| 6,292,383 B1 * | 9/2001 | Worley ........................ | 365/69 |

FOREIGN PATENT DOCUMENTS

| | | | |
|---|---|---|---|
| JP | 59-79492 | 5/1984 | |
| JP | 0005495 | * 1/1986 | ........... G11C/11/34 |

OTHER PUBLICATIONS

Betty Prince, "Semiconductor Memories", 1983, Wiley, 2$^{nd}$ edition, pp. 460–462.*

* cited by examiner

Primary Examiner—Michael Tran
(74) Attorney, Agent, or Firm—McGuire Woods LLP; Daryl K. Neff

(57) ABSTRACT

A fast DRAM memory uses ground-sensing as opposed to traditional Vdd/2 sensing. A selected DRAM cell connects to a bit-line true (BLT) or a bit-line complement (BLC). At the start of each cycle the BLT and BLC are restored to ground potential. A pair of alternating reference cells are provided for each bit-line. When a selected DRAM cell is connected either BLT or BLC the first reference cell in the pair is connected to the other bitline to provide a reference voltage to the other bitline which can be compared to the voltage provided by the selected DRAM cell. On a subsequent cycle using the same bitline the second reference cell in the pair is used. Thus it is not necessary to wait for the first reference cell to recharge prior to beginning the next cycle. Switching between the first and second reference cells in the pair alternates in this manner resulting in faster cycle time. The write-back of the reference cells can be hidden since an alternate cell is available for next cycle's reference bitline generation.

16 Claims, 4 Drawing Sheets

ALTERNATING REFERENCE WORDLINE SCHEME FOR FAST DRAM

BACKGROUND OF THE INVENTION

1. Field of the Invention

The present invention generally relates to dynamic random access memories (DRAMs) and, more particularly to a fast DRAM which uses an alternating reference cells and a ground-sensing technique.

2. Description of the Related Art

Dynamic random access memory (DRAM) performance is a well known limitation to computer system performance. Processor speeds are rapidly outpacing main memory performance, with both processor designers and system manufacturers developing higher performance memory subsystems in an effort to minimize performance limitations due to the slower DRAM devices. Ideally, the memory performance would match or exceed processor performance, i.e., a memory cycle time would be less than one processor clock cycle. This is almost never the case and, so, the memory is a system bottleneck. While microprocessor speed has continued to increase almost exponentially, DRAM performance lacks a corresponding improvement. However, since DRAM memories continue to offer the highest density and lowest cost per bit they remain the most popular choice for computer system main memories.

By way of background, in their simplest form, a single DRAM memory cell comprises a single transistor and a single capacitor. Depending on the convention used, if a charge is stored on the capacitor the cell is said to store a 1-bit. If no charge is present, the cell is said to store a 0-bit. Since the charge on the capacitor dissipates over time, DRAM systems require additional overhead circuitry to periodically refresh the charge on the capacitor. With modern lower voltage devices it is difficult to distinguish the difference between 0 and a 1. Therefore, two bit lines are typically used for each bit with the first in the bit line pair known as bit line true (BLT) and the other being the bit line complement (BLC). In this manner, it is actually the difference between these two bit lines that determines the stored bit value.

The DRAM memory system is actually realized by incorporating many of such DRAM cell pairs in an array. Any pair in the array is addressable by row and column. The rows of the array are referred to a "word-lines" and the columns of the array are referred to as "bit-lines". The bit lines occur in pairs, namely, bit-line true (BLT) and a bit-line complement (BLC). When a particular word-line is selected, all of the bit line pairs in that row are selected by a row address strobe (RAS) signal. Thereafter, a particular bit-line pair is selected by the column address strobe (CAS) which identifies the desired true and complement cell pair in the selected word-line to be read from or written to. A sense amplifier is connected the true and complement bit-lines. The charge transferred from each memory cell to each bit-line in the pair is differentially amplified and latched by the sense amplifier thus reading out the bit.

Over the years, many improvements have been made to DRAM array architectures, address latching and decoding circuits, sensing schemes, data paths, and the like which have greatly increased the speed, reliability and performance of DRAM memories. In particular, engineers have minimized operational power and reduced noise by using what is commonly referred to as half-Vdd (i.e. Vdd/2) sensing schemes. In a Vdd/2 sensing scheme, the bit lines are precharged to a voltage of Vdd/2 prior to reading. With Vdd/2 sensing when a particular cell is selected the charge stored on the memory cell capacitor will be shared with the bit line thus causing the voltage on the bit line to rise above or fall below Vdd/2. This difference is then sensed and amplified to read the bit. While providing benefits such as noise reduction, signal development is slowed due to the time required to precharge the bit lines and lower gain of the cell pass devices.

As is apparent from the above discussion, this type of DRAM system experiences what is commonly referred to as a destructive read. That is, when a particular cell is selected, the charge on the cell capacitor is shared or discharged onto the bit line to be read. Hence, if a charge was stored on the capacitor indicating storage of a "1", after the read the charge is no longer present. Thus, after a read occurs, additional circuitry is required to rewrite the bit back into the memory cell. Traditionally, this rewrite step was done in the same cycle as the read.

So called "fast" DRAM memories have been developed that do not require signal development and write-back of the cell within the same DRAM cycle. The write-back of the cell occurs during a different cycle. As a result, by separating the read and write-back of the cell into two unique cycles the cycle time is decreased by roughly half of a conventional DRAM.

As shown in FIG. 1, there is shown a single column of a fast DRAM memory array. Each memory location comprises a bit-line true (BLT) 10 and a bit-line complement (BLC) 12 line, respectively, connected to a sense amplifier shown in box 14. In addition to a sense amplifier, the box 14 may also include additional circuitry such as isolation devices and bit line precharge circuitry. A plurality of wordlines, labeled WORDLINE-0 to WORDLINE-n, share access to the BLT 10 and BLC 12. Each DRAM cell comprises a single capacitor $16_{0-n}$ and a single FET transistor $18_{0-n}$ used to connect the capacitor to either the BLT 10 or the BLC 12 when the appropriate wordline is selected. Also shown in each DRAM cell is a resistor $20_{0-n}$. However, this is a parasitic resistor inherent to the device and not an actual resistor purposely positioned.

This "fast" DRAM may only be implemented with a half-VDD (Vdd/2) sensing scheme where the bit-lines are precharged to Vdd/2. As noted above, this technique has several disadvantages including slow signal development time, limited low voltage functionality, slow sensing performance from small overdrive, and small signal margins which results in a more sensitive design at lower voltages.

An alternative, perhaps more desirable approach would be to use a ground-sensing scheme. In ground-sensing, each of the bit line pairs are precharged or "restored" to ground potential prior to a read. Thereafter a reference cell is, activated in tandem with the word line to place a reference voltage on one of the bit-lines, either the BLT or BLC.

However, ground sensing will not work with this circuit. As an example, if one were to try and read a 1-bit out from the BLT 10 on WORDLINE-0, using ground-sensing, both BLT 10 and BLC 12 would be restored to ground (i.e. brought to ground potential). WORDLINE-0 is brought active and the charge stored on capacitor $16_0$ would be discharged to the BLT through transistor $18_0$. Assuming ideal conditions and thus neglecting the effects of parasitic resistance $20_0$, the voltage on BLT would be:

$$V_{BLT} = V_C \left( \frac{C_{cell}}{C_{cell} + C_{BLT}} \right)$$

where $V_c$ is the voltage on the cell capacitor $16_0$,
$C_{cell}$ is the capacitance of capacitor $16_0$, and
$C_{BLT}$ is the capacitance of the BLT itself.

The sense amplifier 14 will be set and compares the voltages on BLT 10 and BLC 12. Based on the difference in voltages on BLT 10 and BLC 12, the sense amplifier circuitry 14 will output a signal amplifying BLT 10 to a full rail 1-bit signal and BLC 12 to a full rail 0-bit signal thus signifying that a 1-bit was stored in $16_0$. However, as is apparent, ground sensing does not work well in the event a 0-bit is stored in $16_0$ since in this case both BLT 10 and BLC 12 will have 0-volts on them after reading a 0-bit. Thus, the sense amplifier has nothing to compare leading to unpredictable results since there is no way to determine which of BLT 10 or BLC 12 should be amplified to rail potential.

SUMMARY OF THE INVENTION

The present invention is directed to a fast DRAM memory which uses ground-sensing as opposed to traditional Vdd/2 sensing. A selected DRAM cell connects to a bit-line true (BLT) or a bit-line complement (BLC). A ground-sensing technique is used wherein at the start of each cycle the BLT and BLC are restored to ground potential. A pair of alternating reference cells are provided for each bit-line. When a selected DRAM cell is connected either BLT or BLC the first reference cell in the pair is connected to the other bitline to add a reference voltage to the other bitline which can be compared to the voltage provided by the selected DRAM cell. On a subsequent cycle using the same bitline the second reference cell in the pair is used. In this manner it is not necessary to wait for the first reference cell to recharge prior to beginning the next cycle. Switching between the first and second reference cells in the pair alternates in this manner resulting in faster cycle time. The write-back of the reference cells can be hidden since an alternate cell is available for next cycle's reference bitline generation.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
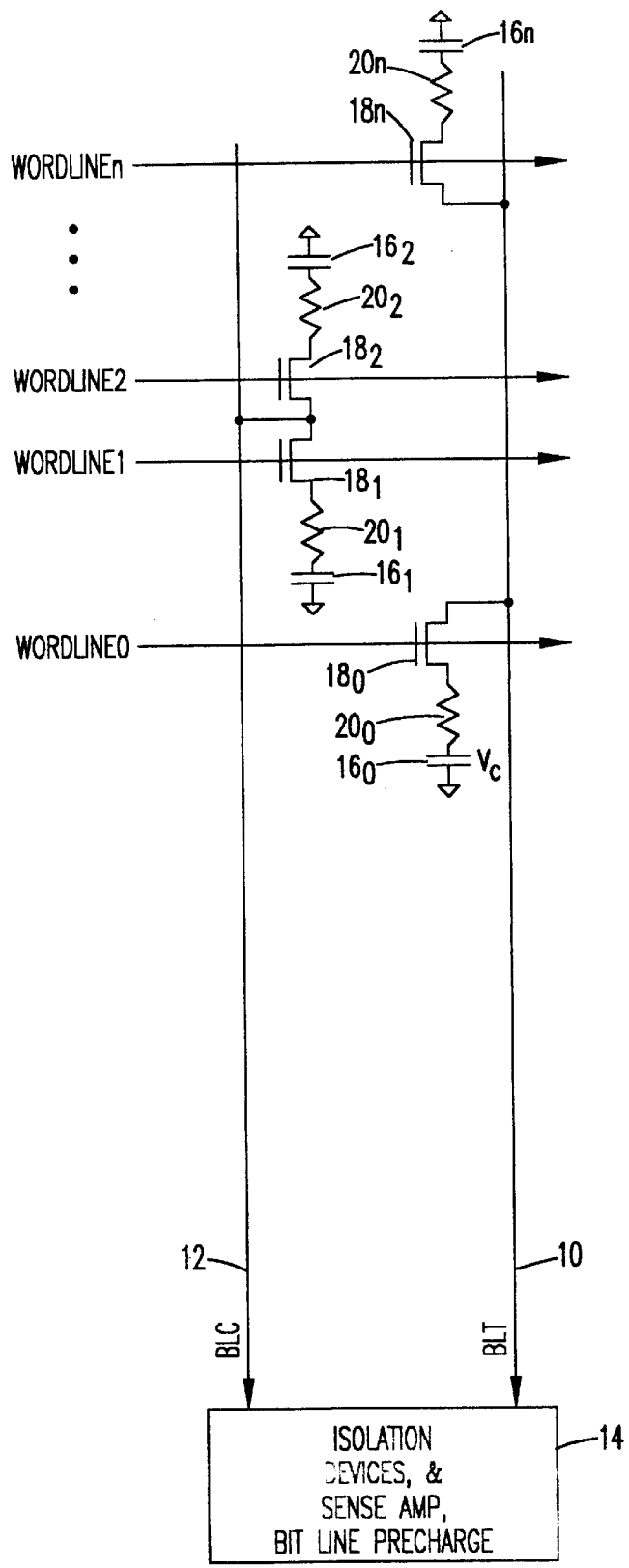
FIG. 1 is a circuit diagram of a single column of a fast DRAM memory array.
Figure 2:
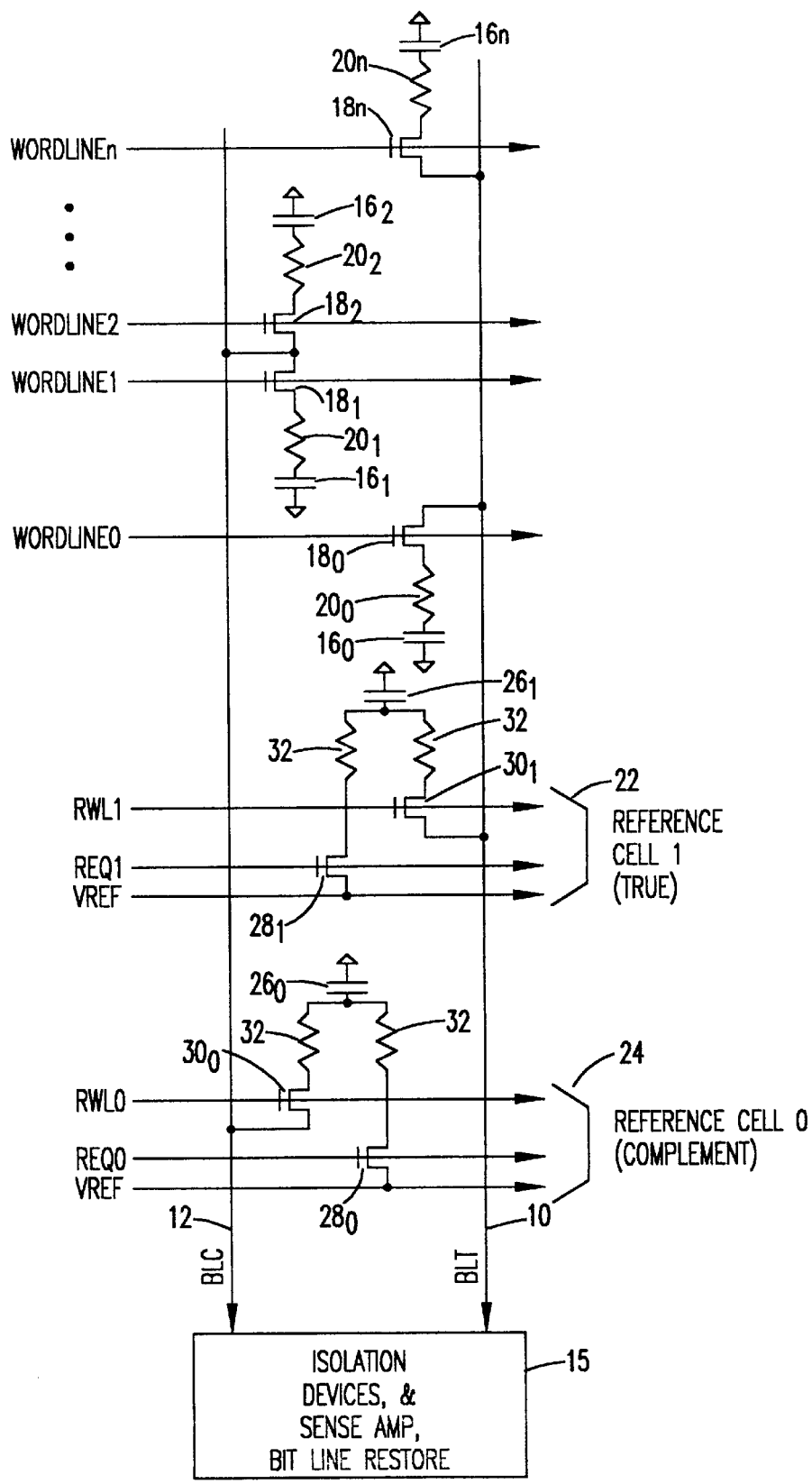
FIG. 2 is a is a circuit diagram of a single column of a fast DRAM memory array using a single reference cell.

Referring now to the drawings, and more particularly to FIG. 2, there is shown a single column of a fast DRAM memory array using a single reference cell similar to FIG. 1 with the addition of reference cells 22 and 24 associated with each of the BLT and BLC, respectively. If ground sensing is to be used in a fast DRAM application, these reference cells should be used. Like elements in the various Figures are labeled with like reference numerals and are therefore not discussed again. Each reference cell includes a reference capacitor 26 which is charged to a reference voltage VREF when a restore signal $REQ_{0\text{-}1}$ activates a restore FET $28_{0\text{-}1}$. VREF is selected as Vdd/2. Another FET $30_{0\text{-}1}$ is provided in each reference cell 22 and 24 to connect the reference cell to either the BLC or BLT when either RWL0 or RWL1 is activated. Again, each of the capacitors 26 have parasitic resistances associated therewith collectively referenced as 32.

Following the same example as used above in FIG. 1, in order to read out a 1-bit from BLT 10 on WORDLINE-0, both BLT 10 and BLC 12 are restored to ground (i.e. brought to ground potential) by bit line restore circuitry in box 15). Ground restore circuitry, isolation devices and sense amplifiers 15 are well known in the art and therefore details of these devices is omitted. REQ0 in the reference cell 24 is activated to charge reference cell capacitor $26_0$ to the potential on VREF through transistor $28_0$. WORDLINE-0 is brought active and the charge stored on capacitor $16_0$ is discharged to BLT 10 through transistor $18_0$, as before. Simultaneously with WORDLINE-0 being brought active the reference cell will be brought active thus discharging the charge stored in the reference cell 24 onto the complement bit-line BLC 12. The voltage on BLT 10 and BLC 12 is given by the equation:

$$V_{BLT} = V_C \left( \frac{C_{cell}}{C_{cell} + C_{BLT}} \right), \quad V_{BLC} = V_{ref} \left( \frac{C_{ref}}{C_{ref} + C_{BLC}} \right)$$

where
$V_c$ is the voltage on the cell capacitor $16_0$ (Vdd),
$C_{cell}$ is the capacitance of capacitor $16_0$, and
$C_{BLT}$ is the capacitance of the BLT line itself, and
where
$V_{ref}$ is the voltage on the reference capacitor $26_0$, (Vdd/2),
$C_{ref}$ is the capacitance of capacitor $26_0$, and
$C_{BLC}$ is the capacitance of the BLC line itself.

In this case, assuming all capacitances are the same, $V_{BLT}$ will be greater than $V_{BLC}$ since $V_c$ is greater than $V_{ref}$. Thus, the sense amplifier will be set and will output a signal amplifying BLT to a full rail 1-bit signal and BLC to a full rail 0-bit signal thus signifying that a 1-bit was stored in $16_0$.

Unlike the example shown in FIG. 1, using the reference cells 22 and 24 will also allow a 0-bit to be read out of the fast DRAM using ground-sensing. In the case of a 0-bit is stored in cell $16_0$, as seen in the above equations the voltage of BLT 10 will be 0-volts since Vc is 0-volts. However, BLC 12 will have a voltage on it due to the contribution of $V_{ref}$ provided by the reference cell 24. Thus, the sense amplifier can accurately compare the difference between $V_{BTL}$ and $V_{BTC}$ and output a full rail signals for BLT 10 and BLC 12 indicating a 0-bit stored at cell $16_0$.

However, although more robust, this scheme proves to be slow for this application. The reason being that the reference cell (22 or 24) needs to be written back after being accessed in preparation for the next cycle. As a result, the benefits of the "fast" DRAM architecture are severely impacted.

Figure 3:
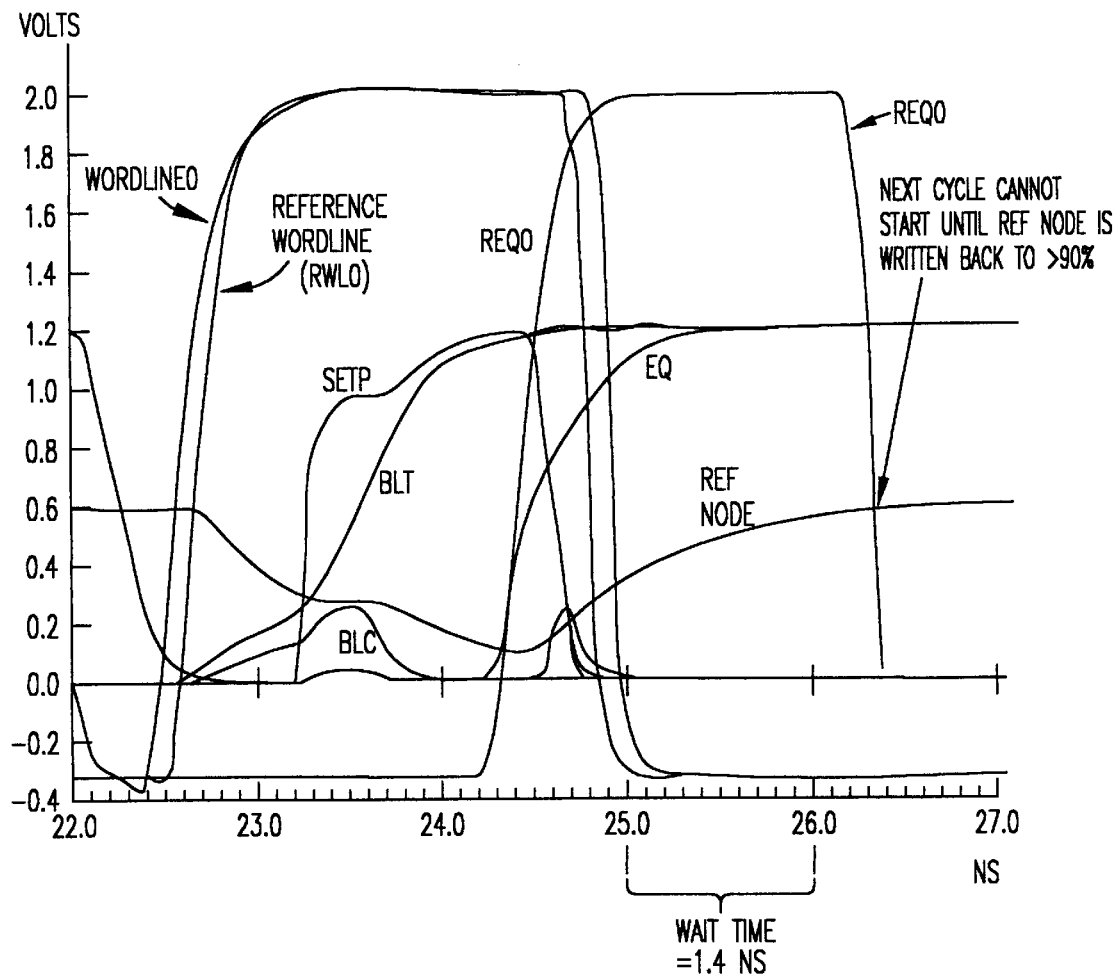
FIG. 3 is a waveform diagram of a single cycle of a DRAM cell read illustrating the wait time required when using a single reference cell.

FIG. 3 shows a waveform diagram illustrating the problem. At the start of a cycle, an equalization signal EQ is active thus causing BLT 10 and BLC 12, to be restored to ground potential. The voltage on the reference node $26_0$ (REF NODE) is set to $V_{ref}$ (in this case, 0.6 Volts). WORDLINE-0 and the reference wordline (RWL0) are then selected causing these signals to rise almost in unison. Once the WORDLINE-0 and RWL0 are active, the sense amplifier 15 is set by signal SETP. The active WORDLINE-0 will cause cell $16_0$ to begin to discharging onto BLT causing the voltage on BLT to rise (assuming a 1-bit is stored at $16_0$). Similarly, the active RWL0 will cause the reference cell capacitor $26_0$ to discharge onto BLC 12. As shown, BLT 10 will raise higher than BLC 12. The sense amplifier 15 will differentially amplify this difference to read a 1-bit stored at cell $16_0$. Immediately thereafter the equalization signal EQ goes active thus causing BLT 10 and BLC 12 to be restored to ground potential readying for the next cycle. The REQ0 signal also goes active at this point in order to recharge the reference node capacitor $26_0$ with $V_{ref}$. However, the problem lies in the fact that the next cycle cannot begin until the reference node is charged to at least 90% of $V_{ref}$. This translates in practical terms to a wait time of approximately 1.4 ns in this example.

Figure 4:
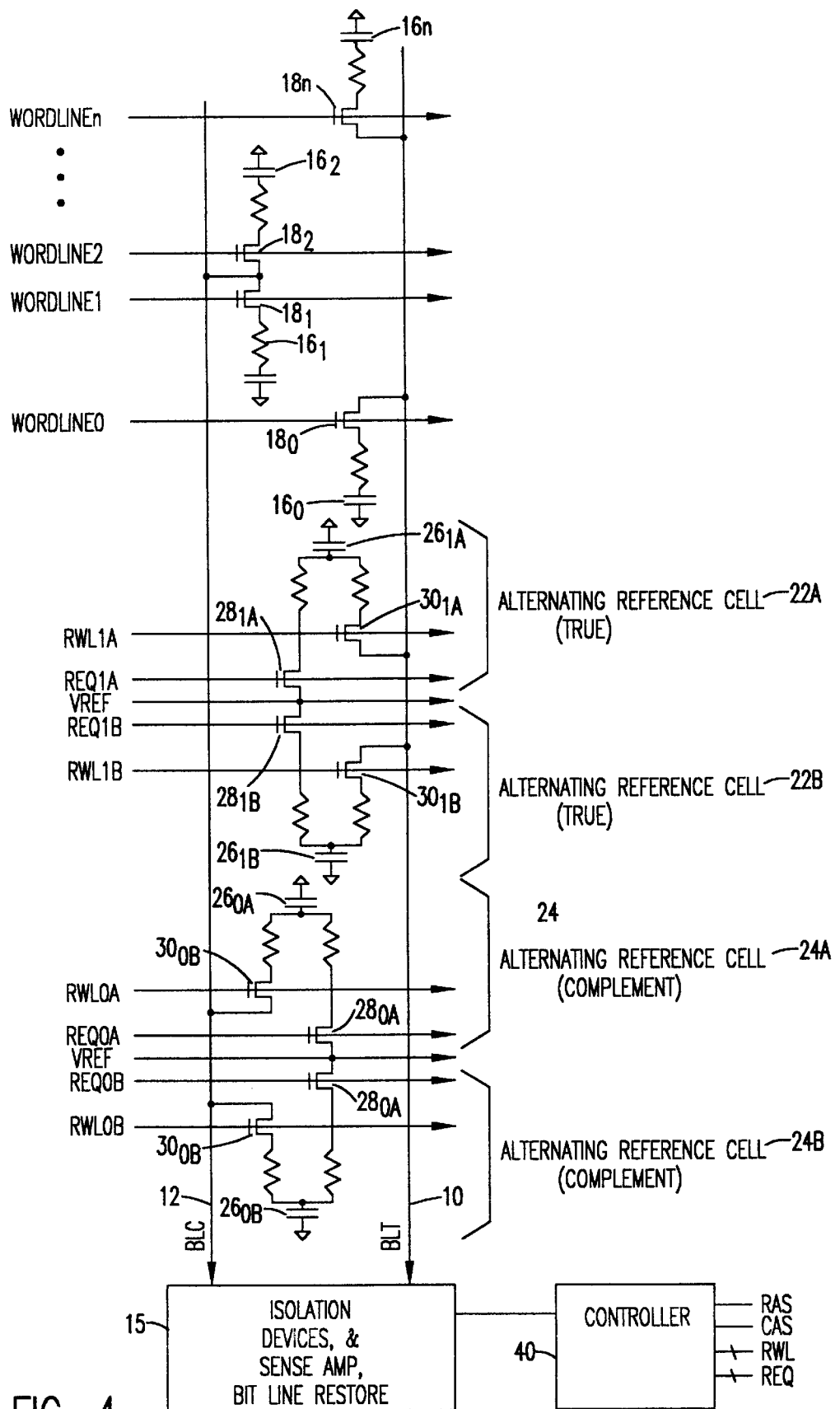
FIG. 4 is a circuit diagram of a single column of a fast DRAM memory array using a pair of alternating reference cells.

As shown in FIG. 4 in the preferred embodiment of the present invention, a pair of cells (22A–B and 24A–B) are used for each bit line rather than just one for each bit line as shown in FIG. 2. Again, like items are labeled with like reference numerals with the reference numerals to the parasitic resistances being omitted to avoid clutter. Preferably, the reference cells in each pair are the mirror image of each of other about VREF as shown. The alternating reference cells are used for each bitline to accomplish faster cycle time. As previously discussed using a singles reference cell, a next cycle cannot begin until the reference cell 26 is recharged to at least 90% of $V_{ref}$ leading to undesired wait time. However, by using two alternating reference cells for each bit-line, if two adjacent wordlines are accessed back-to-back (e.g., WORDLINE-1 and WORDLINE-2), reference cell 22A would be assessed for the first cycle by selecting wordline RWL1A simultaneously with WORDLINE-1 and reference cell 22B would be accessed for the second cycle by selecting RWL1B simultaneously with WORDLINE-2. A controller 40 includes control circuitry for alternating between the reference cell pairs when adjacent wordlines are selected on adjacent cycles. While the second reference cell 22B is being used, the first reference cell can be written back. As a result, the second wordline activation can occur shortly after bitlines are fully precharged thus eliminating the wait time associated with using just one reference cell. In a similar fashion, reference cells 24A and 24B are used whenever accesses are made to cells on bitline BLT 10.

While the invention has been described in terms of a single preferred embodiment, those skilled in the art will recognize that the invention can be practiced with modification within the spirit and scope of the appended claims.

We claim:

1. A dynamic random access memory device comprising:
   a plurality of wordlines;
   a plurality of memory cells for storing a 1-bit or a 0-bit;
   a pair of bitlines comprising a bitline true (BLT) and a bitline complement (BLC), each said plurality of memory cells being selectively connected to one of said BLT and BLC when a corresponding one of said plurality of wordlines is selected,
   a first pair of reference cells connected to said BLT;
   a second pair of reference cells connected to said BLC; and
   a controller for alternating said first pair of reference cells when a memory cell is connected to said BLC on successive cycles, and for alternating said second pair of reference cells when a memory cell is connected to said BLT on successive cycles;
   wherein said controller restores each of said BLT and said BLC to ground potential at a start of each cycle.

2. A dynamic random access memory device comprising:
   a plurality of wordlines;
   a plurality of memory cells for storing a 1-bit or a 0-bit;
   a pair of bitlines comprising a bitline true (BLT) and a bitline complement (BLC), each said plurality of memory cells being selectively connected to one of said BLT and BLC when a corresponding one of said plurality of wordlines is selected;
   a first pair of reference cells connected to said BLT;
   a second pair of reference cells connected to said BLC; and
   a controller for altering said first pair of reference cells when a memory cell is connected to said BLC on successive cycles, and for alternating said second pair of reference cells when a memory cell is connected to said BLT on successive cycles;
   wherein each of said reference cells comprise:
      a capacitor for storing a reference voltage,
      a first switch for connecting said capacitor to a reference voltage line for charging said capacitor; and
      a second switch for connecting said capacitor to one of said BLT and said BLC for discharging said capacitor.

3. A dynamic random access memory device as recited in claim 2 wherein said reference voltage is Vdd/2.

4. A dynamic random access memory device comprising:
   a plurality of wordlines;
   a plurality of memory cells for storing a 1-bit or a 0-bit;
   a pair of bitlines con a bitline true (ELT) and a bitline complement (BLC), each said plurality of memory cells being selectively connected to one of said HLT and BLC when a corresponding one of said plurality of wordlines is selected;
   a first pair of reference cells connected to said BLT;
   a second pair of reference cells connected to said BLC; and
   a controller for alternating said first pair of reference cells when a memory cell is connected to said BLC on successive cycles, and for alternating said second pair of reference cells when a memory cell is connected to said BLT on successive cycles wherein each reference cell in said first and second reference cell pair is a mirror image of the other reference cell.

5. A method of controlling a fast dynamic random access memory (DRAM) with ground-sensing, comprising the steps of:
   in a first cycle:
      restoring a bitline pair to around potential;
      connecting a first DRAM cell to a first bitline in said bitline pair causing said DRAM cell to share a charge stored therein with said first bitline;
      connecting a first in a pair of reference cells to a second bitline causing said first reference cell to share a reference charge stored therein with said second bitline; and
      sensing a voltage difference between said first and second bitlines;

in subsequent cycles:
  restoring said bitline pair to ground potential;
  connecting another DRAM cell to said first bitline causing said another DRAM cell to share a charge stored therein with said first bitline;
  alternately connecting said first and a second of said reference cell pair to said second bitline causing said connected reference cell share a reference charge stored therein with said second bitline; and
  sensing a voltage difference between said first and second bitlines.

6. A method of controlling a fast dynamic random access memory (DRAM) with ground-sensing as recited in clam 5 further comprising the step of:
  recharging one of said first and said second reference cells while the other is connected to said bitline.

7. A method of controlling a fast dynamic random access memory (DRAM) with ground-sensing as recited in clam 6 wherein said first and said second reference cells is charged to Vdd/2.

8. A dynamic random access memory device comprising:
  a first pair of reference cells switchably connected to a bitline true (BLT);
  a second pair of reference cells switchably connected to a bit line complement (BLC),
  wherein first and second reference cells in said first pair of reference cells are alternately connected to said BLT when a memory cell is connected to said BLC on successive cycles, and first and second reference cells in said second pair of reference cells are alternately connected to said BLC when a memory cell is connected to said BLT on successive cycles wherein each of said BLT and said BLC are restored to ground potential at a start of each cycle.

9. A dynamic random access memory device comprising:
  a first pair of reference cells switchably connected to a bitline true (BLT);
  a second pair of reference cells switchably connected to a bit line complement (BLC),
  wherein first and second reference cells in said first pair of reference cells are alternately connected to said BLT when a memory cell is connected to said BLC on successive cycles, and first and second reference cells in said second pair of reference cells are alternately connected to said BLC when a memory cell is connected to said BLT on successive cycles;
  wherein each of said reference cells comprise:
    a capacitor for storing a reference voltage;
    a first switch for connecting said capacitor to a reference voltage line for charging said capacitor; and
    a second switch for connecting said capacitor to one of said BLT and said BLC for discharge said capacitor.

10. A dynamic random access memory device as recited in claim 9 wherein said reference voltage is Vdd/2.

11. A dynamic random access memory device comprising:
  a first pair of reference cells switchably connected to a bitline true (BLT);
  a second pair of reference cells switchably connected to a bit line complement (BLC),
  wherein first and second reference cells in said first pair of reference cells are alternately connected to said BLT when a memory cell is connected to said BLC on successive cycles, and first and second reference cells in said second pair of reference cells are alternately connected to said BLC when a memory cell is connected to said BLT on successive cycles;
  wherein each reference cell in said first and second reference cell pair is a mirror image of the other reference cell.

12. A method of operating a fast dynamic random access memory DRAM comprising the steps of:
  providing a first pair of reference cells to a bitline true (BLT);
  providing a second pair of reference cells to a bit line complement (BLC);
  alternately connecting first and second reference cells in said first pair of reference cells to said BLT when a memory cell is connected to said BLC on successive cycles, and alternately connecting first and second reference cells in said second pair of reference cells to said BLC when a memory cell is connected to said BLT on successive cycles; and
  restoring each of said BLT and said BLC to ground potential at a start of each cycle.

13. A method of operating a fast dynamic random access memory (DRAM) comprising the steps of:
  providing a first pair of reference cells to a bitline true (BLT);
  providing a second pair of reference cells to a bit line complement (BLC);
  alternately connecting first and second reference cells in said first pair of reference cells to said BLT when a memory cell is connected to said BLC on successive cycles, and alternately connecting first and second reference cells in said second pair of reference cells to said BLC when a memory cell is connected to said BLT on successive cycles; and
  charging said reference cells in said first and second pairs of reference cells to a reference voltage of Vdd/2.

14. A method of operating a first dynamic random access memory (DRAM) comprising the steps of:
  providing a first pair of reference cells to a bitline true (BLT);
  providing a second pair of reference cells to a bit line complement (BLC);
  alternately connecting first and second reference cells in said first pair of reference cells to said BLT when a memory cell is connected to said BLC on successive cycles, and alternately connecting first and second reference cells in said second pair of reference cells to said BLC when a memory cell is connected to said BLT on successive cycles; and
  charging one reference cell in said first or second pair of reference cells while discharging the other reference cell in said pair of reference cells.

15. A method of operating a fast dynamic random access memory (DRAM) comprising the steps of:
  providing a pair of reference cells to a first bitline;
  alternately connecting a first reference cell and a second reference cell in said pair of reference cells to a second bitline when a memory cell is connected to said first bitline on successive cycles; and
  restoring said bitline to ground potential at a start of each cycle.

16. A method of operating a fast dynamic random access memory (DRAM) comprising the steps of:
  providing a pair of reference cells to a first bitline;
  alternately connecting a first reference cell and a second reference cell in said pair of reference cells to a second bitline when a memory cell is connected to said first bitline on successive cycles; and
  charging said reference cells in said pair of reference cells to a reference voltage of Vdd/2.

* * * * *

UNITED STATES PATENT AND TRADEMARK OFFICE
CERTIFICATE OF CORRECTION

PATENT NO.    : 6,501,675 B2
DATED         : December 31, 2002
INVENTOR(S)   : Harold Pilo et al.

It is certified that error appears in the above-identified patent and that said Letters Patent is hereby corrected as shown below:

Column 6,
Line 38, change "con" to -- comprising --.
Line 58, change "around" to -- ground --.

Signed and Sealed this

Fourth Day of March, 2003

JAMES E. ROGAN
*Director of the United States Patent and Trademark Office*